United States Patent [19]
Griph

[11] Patent Number: 6,037,891
[45] Date of Patent: Mar. 14, 2000

[54] LOW POWER SERIAL ANALOG-TO-DIGITAL CONVERTER

[75] Inventor: Richard Steven Griph, Mesa, Ariz.

[73] Assignee: Motorola, Inc., Schaumburg, Ill.

[21] Appl. No.: 09/027,759

[22] Filed: Feb. 23, 1998

[51] Int. Cl.[7] .................................. H03M 1/38
[52] U.S. Cl. .......................... 341/161; 341/155; 327/491
[58] Field of Search .................... 341/161, 135, 341/136, 143, 124, 125; 327/65, 407, 411, 491

[56] References Cited

U.S. PATENT DOCUMENTS

| | | | |
|---|---|---|---|
| 4,369,500 | 1/1983 | Fette | 364/758 |
| 4,665,382 | 5/1987 | Morgan | 340/347 |
| 4,740,907 | 4/1988 | Shimizu et al. | 364/784 |
| 4,916,653 | 4/1990 | Shimizu et al. | 364/784 |
| 4,918,640 | 4/1990 | Heimsch et al. | 364/768 |
| 5,047,772 | 9/1991 | Ribner | 341/156 |
| 5,059,829 | 10/1991 | Flannagan et al. | 307/475 |
| 5,130,572 | 7/1992 | Stitt et al. | 307/353 |
| 5,132,921 | 7/1992 | Kelley et al. | 364/784 |
| 5,134,579 | 7/1992 | Oki et al. | 364/786 |
| 5,237,332 | 8/1993 | Estrick et al. | 342/174 |
| 5,315,170 | 5/1994 | Vinn et al. | 307/353 |
| 5,347,482 | 9/1994 | Williams | 364/757 |
| 5,444,447 | 8/1995 | Wingender | 341/156 |
| 5,471,413 | 11/1995 | Sali et al. | 364/786 |
| 5,485,106 | 1/1996 | Drost et al. | 326/66 |
| 5,491,653 | 2/1996 | Taborn et al. | 364/784 |
| 5,499,027 | 3/1996 | Karanicolas et al. | 341/120 |
| 5,510,736 | 4/1996 | Van de Plassche | 327/91 |
| 5,586,071 | 12/1996 | Flora | 364/758 |
| 5,596,520 | 1/1997 | Hara et al. | 364/786 |
| 5,635,937 | 6/1997 | Lim et al. | 341/161 |
| 5,638,071 | 6/1997 | Capofreddi et al. | 341/118 |

Primary Examiner—Howard L. Williams
Assistant Examiner—Peguy Jean-Pierre
Attorney, Agent, or Firm—Gregory J. Gorrie

[57] ABSTRACT

A low power serial A/D converter cascades multiple stages (20) of a novel track-and-hold circuit (22) to implement a pipelined A/D converter. The track-and-hold circuit (22) is implemented using a differential structure to cancel out signal droop. This allows extremely high tracking bandwidths to be achieved while maintaining long hold times. Each stage (20) of the pipeline includes a binary quantizing circuit (24) which performs a 1-bit binary estimate of the data and a summing circuit (26) which updates the output of its track-and-hold circuit (22) to allow the next bits to be decided by the following stages.

14 Claims, 4 Drawing Sheets

-PRIOR ART-

LOW POWER SERIAL ANALOG-TO-DIGITAL CONVERTER

FIELD OF THE INVENTION

The invention pertains to analog-to-digital converters.

BACKGROUND OF THE INVENTION

Due to an ever increasing demand for high speed components in electronic applications, the availability of high speed analog-to-digital (A/D) converters is becoming very important. High speed A/D converters are conventionally implemented using a flash architecture. Each comparator in a flash A/D compares reference voltages to the analog inputs. When the reference is more positive, the decision circuit outputs a 1 and when it is more negative, it outputs a zero (−1). The analog voltage is quantized by finding which two reference voltages the input voltage is between Although flash architecture A/D converters do provide speed, they also use $2^n-1$ comparators, where n is the bit-number accuracy. Thus, an 8-bit A/D converter uses 255 comparators. Likewise, a 9-bit A/D comparator uses 511 comparators, and a 10-bit A/D comparator uses 1023 comparators. The more logic gates used, the higher the power consumption, die size, and cost of the circuit. The parallel gates used in flash A/D's are a problem because, among other things, connecting these gates either loads the input with parasitic loading or uses a fanout approach which can cause the signals at the parallel sections of the chip to differ.

A/D converters rely on the values of their circuit components, typically resistors or capacitors, to form ratios that digitally represent the ratio of an input signal to a reference signal. As a result, the primary limitation on the accuracy that can be achieved with an A/D converter is the variation in the values of the components. This variation, known as component mismatch, causes these ratios to deviate from their nominal values, which, in turn, produces errors in the digital representation of the input signal.

An alternative arrangement to the flash architecture is known as a serial, or "pipelined", architecture. One such pipelined architecture technique is shown in U.S. Pat. No. 5,047,772 to Ribner. Ribner describes a basic sub-ranging A/D converter comprising two or more similar conversion stages connected together in a cascade arrangement. Each conversion stage includes a sample-and-hold (S/H) circuit to which an analog input signal is applied. Each stage uses a low resolution A/D converter to generate a binary conversion signal corresponding to the nearest quantized level below that of the analog input signal applied of the sample-and-hold circuit of that stage, while a companion D/A converter generates a quantized analog signal corresponding to the nearest quantized level below that of the analog input signal applied to the sample-and-hold circuit of that stage. This quantized analog signal in each stage is subtracted from the analog input signal in that stage. A subsequent gain amplifier in each stage boosts the residual signal in that stage back to a level consistent with the input range of the next stage. Thus, each stage digitally approximates its analog input signal and passes the remainder of that analog signal, after amplification, to the following stage for further processing. Normally, design dictates that the interstage gain be $2^L$ for a stage with an L-bit A/D and D/A converter to boost the residual signal up to the full scale level of the following stage.

In a pipelined operation, the signal processed by each stage is delayed from the preceding stage by one sample period. Thus a latency of M-clock cycles or M-half clock cycles is desirably required before an output signal is available from the final stage. The output signals of earlier stages are available sooner and are delayed accordingly before being combined into a single output signal. The parallel outputs from each conversion stage are combined to produce a resultant binary output signal which represent the analog input signal to the multi-stage analog-to-digital converter.

Heretofore, high speed A/D conversions have not been achieved using pipelined architecture A/D converters because a sampling circuit, utilized in each pipeline stage, which provides a high input tracking bandwidth, minimal sampling aperture, and minimal sampling errors has not been available. The tracking bandwidth is the speed at which the sampling circuit can track its input. Sampling aperture is the time the circuit responds to the input after it is switched to a holding mode. Settling time is the time the circuit rings after switching. The circuit is capable of ringing for some time after it no longer responds to the input. Sampling a high frequency input desirably requires a high tracking bandwidth and a short sampling aperture. The sampling aperture can also be expressed as a sampling aperture bandwidth. The sampling aperture bandwidth is the equivalent bandwidth of integrating the input signal during the sampling aperture time and is equal to 1/(2* Sample Aperture Time). To track and hold a high frequency signal, both the tracking bandwidth and the sampling aperture bandwidths are higher than the bandwidth of the signal being sampled.

To achieve the bandwidth, sampling aperture and sampling error requirements for a high speed A/D converters, the sampling circuits used to implement it are desirably highly linear to achieve very low sampling error rates. One reason such a sampling circuit has been difficult to implement is that the components available to implement the sampling circuit, namely, bipolar NPN transistors, resistors and capacitors, are inherently non-linear and switch from high to low and low to high asymmetrically.

Accordingly, a need exists for a pipelined architecture A/D converter which operates at high speeds, consumes minimal power and occupies minimal die space. A need also exists for a sampling circuit which provides high bandwidth, low sampling aperture, and low sampling error rates.

BRIEF DESCRIPTION OF THE DRAWINGS

The invention will be better understood from a reading of the following detailed description taken in conjunction with the drawings in which like reference designators are used to designate like elements, and in which.

The exemplification set out herein illustrates a preferred embodiment of the invention in one form thereof, and such exemplification is not intended to be construed as limiting in any manner.

DETAILED DESCRIPTION OF THE DRAWINGS

The invention, in the preferred embodiments, provides a low power serial A/D converter using high speed track-and-hold circuits. The A/D converter employs highly linear cascaded pipeline stages which use a one-bit error conversion per stage. Each stage employs moderate positive feedback to help provide a high tracking bandwidth. In the preferred embodiments, the A/D converter switches quickly between track hold modes and sample hold modes.

A novel track-and-hold circuit is employed as a core element of the A/D converter. The track-and-hold circuit is implemented using a differential structure to cancel out signal droop. This allows extremely high tracking bandwidths to be achieved while maintaining long hold times. The track-and-hold is designed into the comparator stages of the serial A/D converter in a novel fashion.

The A/D converter of the invention cascades multiple stages of the track-and-hold circuit to implement a pipelined A/D converter. Each stage of the pipeline performs a 1-bit binary estimate of the data and updates the output of its track-and-hold circuit to allow the next bits to be decided by the following stages. One implementation built in accordance with the A/D converter of the invention has shown the ability to support a 10 bit A/D sampling at a sampling rate in excess of 2.4 GHz.

Figure 1:
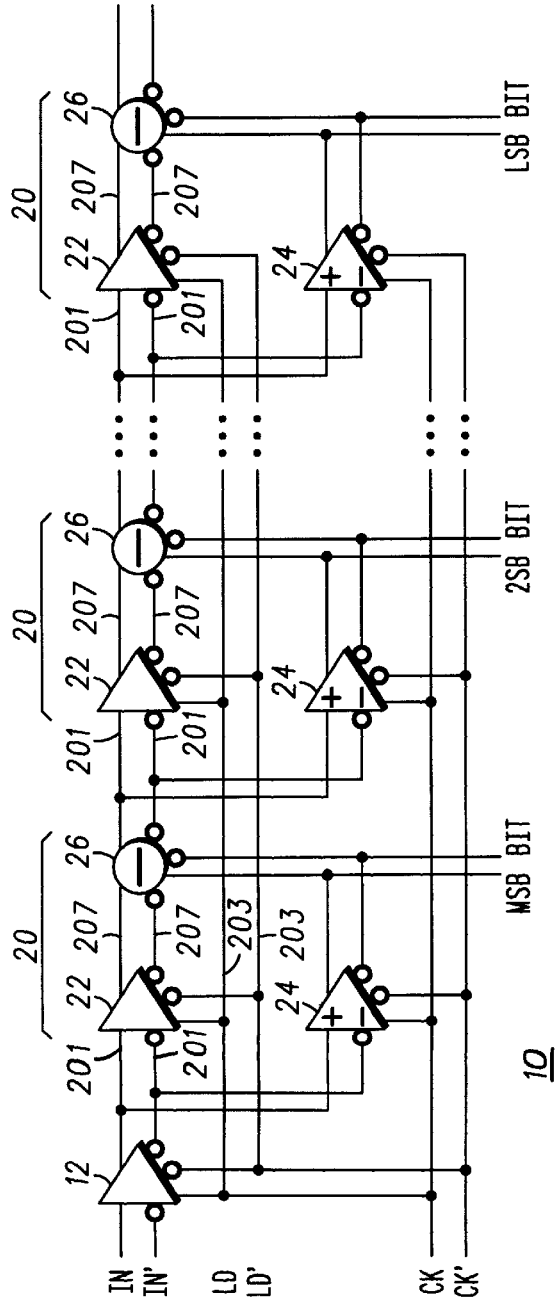
FIG. 1 is a block diagram of a pipelined analog-to-digital converter in accordance with a preferred embodiment of the present invention.

FIG. 1 is a block diagram of a pipelined A/D converter 10 in accordance with the invention. A/D converter 10 includes an input track-and-hold circuit 12 and a plurality of pipeline track-and-hold stages 20 connected together in a cascade arrangement. Each pipeline track-and-hold stage 20 respectively includes a track-and-hold circuit 22, a binary quantizing circuit 24, and a summing circuit 26. Input track-and-hold circuit 12 operates to sample differential input signal IN/IN' with high accuracy. Pipeline track-and-hold stage 20 receives the signal output of input track-and-hold circuit 12. Each respectively receives the signal output of its preceding pipeline track-and-hold stage 20. Each pipeline track-and-hold stage 20 performs a 1-bit estimation on its input using a binary quantizing circuit 24, and updates its held output value using summing circuit 26 with an error term. In the embodiment shown in FIG. 1, the error term is one times the maximum analog input signal (hereinafter "+1") if the input is negative and the error term is negative one times the maximum analog input signal (hereinafter "−1") if the input is positive. Summing circuits 26 perform the update of the output value of each respective stage 20. Preferably, the voltage gain of track-and-hold circuits 22 is two (i.e., the output signal level is double that of the input signal level). This allows the voltages estimated by the following stages to be at the correct levels such that a positive/negative determination correctly estimates the next bits of the A/D converter 10.

The track-and-hold circuits 22 in each pipeline track-and-hold stage 20 de-couples the stage 20 and collectively provides an analog delay pipeline. In other words, each alternating stage 20 is clocked similarly every half clock cycle. For example, each odd numbered stage 20 tracks while each even numbered stage 20 holds in one half clock cycle; likewise, each even numbered stage 20 tracks while each odd numbered stage 20 holds during the next half clock cycle. In pipelined operation, the signal processed by each stage 20 is delayed from the preceding stage by a half clock cycle. Thus a latency of M/2 clock cycles is desirably required before an output signal is available from the final stage, where M is the number of bits. The output signals of earlier stages are available sooner and are delayed accordingly before being combined into a single output signal. This is implemented (not shown) by advancing the binary quantized signal from the binary quantizing circuit of each pipelined T/H stage 20 through a plurality of stages of latches in each pipelined T/H stage 20. The latch in each successive pipelined T/H stage 20 has one less stage than the latch of the previous pipelined T/H stage, except for the final pipelined T/H stage 20 which employs no latch. The parallel outputs from each pipelined T/H stage 20 are combined to produce a resultant quantized digital output signal which represents the analog input signal to the multi-stage A/D converter. In the preferred embodiments, the latches have alternating polarity of the clock connected to their latch line.

According to one embodiment of the present invention, an 8-bit A/D converter performs only eight decisions. Likewise, according to another embodiment of the present invention, a 10-bit A/D converter performs only ten decisions. In order to achieve a high bandwidth, a low sampling aperture, and low sampling error rates, track-and-hold circuits 12, 22 are desirably highly linear circuits and provide very fast switching time.

Figure 2:
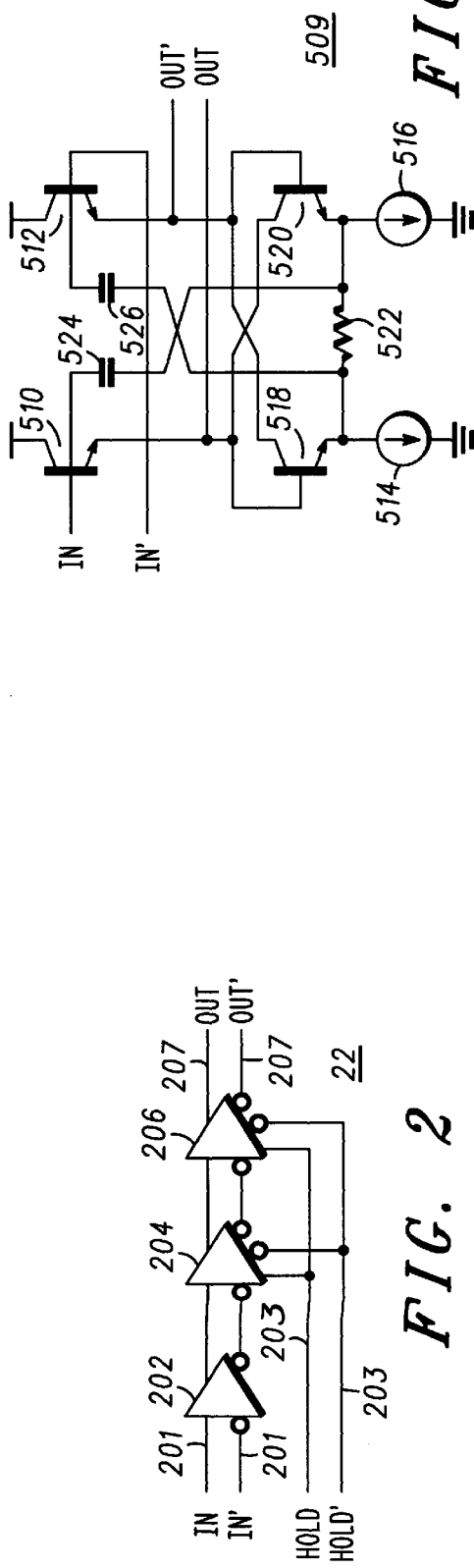
FIG. 2 is a block diagram of a track and hold circuit used in the A/D converter of FIG. 1 in accordance with a preferred embodiment of the present invention.

FIG. 2 is a block diagram of a track and hold circuit 22 used in the A/D converter of FIG. 1 in accordance with a preferred embodiment of the present invention. Track-and-hold circuit 22 produces a differential output signal OUT/OUT' at input 201, which tracks a differential input signal IN/IN' during a track mode (i.e., differential mode signal HOLD/HOLD' at input 203 is false), and which holds that value of input signal IN/IN' at input 201 during a hold mode, i.e., differential mode signal is true. The value of the differential output on OUT/OUT' is the value of the input signal IN/IN' at the time the track-and-hold circuit 22 transitions to hold mode.

In the embodiment of FIG. 2, track-and-hold circuit 22 includes an input buffer 202, a sampling switch 204, and a read buffer 206. Input buffer 202 isolates the track-and-hold circuit 22 from differential input signal IN/IN' at input 201, and ensures that the input signal IN/IN' is at the proper voltage levels. Input buffer 202 is a passive portion of the track-and-hold circuit 22 in the sense that it does not switch modes. The track-and-hold function of track-and-hold circuit 22 is accomplished by the sampling switch 204. Sampling switch 204 operates in a track mode to cross-connect input signal IN/IN' to its output. Sampling switch 204 also operates in a hold mode to isolate input signal IN/IN' from its output (i.e., to leave its output in a floating state). The output of sampling switch 204 maintains its value via either stray or intentionally applied capacitance. Read buffer 206 reads the value of the output held by sampling switch 204 without disrupting the value when reading it. Accordingly, read buffer 206 is desirably a high impedance circuit.

In the embodiment shown in FIG. 2, track-and-hold circuit components are implemented using differential techniques. The switching characteristics are symmetric relative to differential processing.

As discussed previously, input buffer 202 is a passive element in the sense that it is not being switched. However, input buffer 202 is highly linear and also has a high bandwidth. Input buffer 202 may be implemented using an emitter follower circuit for performing any level shifting of the input signal followed by a differential amplifier. In a preferred embodiment, the level shifting function of the emitter follower is optional when, for example, the differential amplifier provides isolation for the input buffer.

Figure 3:
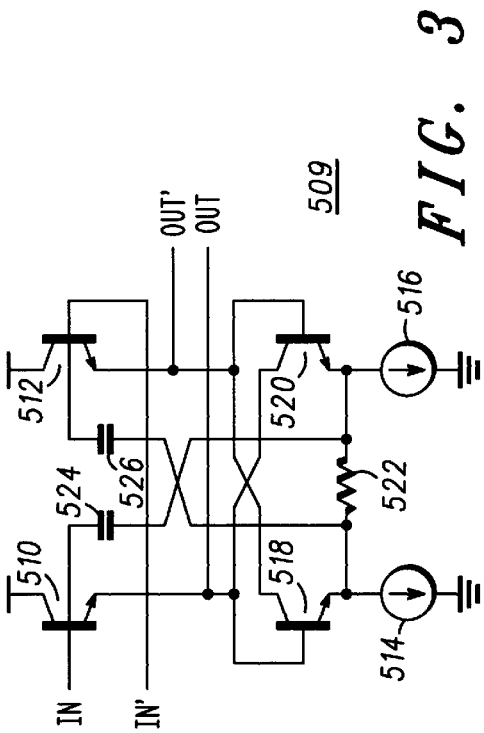
FIG. 3 is a schematic diagram of a linearized emitter follower circuit in accordance with a preferred embodiment of the present invention.

Because the track-and-hold circuit 22 of FIG. 2 desires high linearity, input buffer 202 desirably provides the functionality of an emitter follower and a differential amplifier without their inherent non-linearities. Accordingly, input buffer 202 is preferably implemented using a linearized emitter follower and a differential amplifier Which provides the functionality of both an emitter follower and a differential amplifier while maintaining high linearity. FIG. 3 is a schematic diagram of a preferred embodiment linearized emitter follower 509 in accordance with a preferred embodiment of the present invention. The cacsade of Linearized emitter follower 509 and a differential amplifier are linear in that their gain and linearity are only weakly affected by changes in the transistor base emitter junction non-linearity. The responses of each the Linearized emitter follower and differential amplifier are non-linear when taken separately and the Linearized emitter follower is designed to substantially invert the non-linearity in the differential amplifier. The insensitivity to the junction non-linearity causes the combined responses of the two circuit to be effected only weakly by changes in the circuit fabrication process, temperature, or inaccuracies in the models of the actual transistors. The variation in gain of linearized emitter follower 509 cascaded with a differential amplifier is preferably less than 0.5% across its operating temperature in order to ensure that input buffer 202 is linear and has unity gain. Linearized emitter follower 509 cascaded with a differential amplifier also has a built-in high-pass response, which assists in precharging the holding capacitors of the track-and-hold circuit 200 and results in higher tracking bandwidth. Linearized emitter follower 509 is similar to a conventional emitter follower in that it includes level shifting transistors 510, 512 and current sources 514, 516 arranged in a emitter follower configuration.

Linearized emitter follower 509 improves over conventional emitter followers by combining the follower amplifier with differential matching transistor elements 518, 520 and a resistive element 522 in a second differential amplifier configuration. These elements 518, 520, 522 inject a negative non-linearity into the emitter follower output to cancel the positive non-linearity found in the external differential amplifier configuration cascaded with linearized emitter follower. The additional elements also provide a small amount of positive feedback in the emitter follower which manifests itself as peaking in the transfer function of the unloaded circuit. This high pass response is used to increase the bandwidth of the loaded circuit because loading the circuit induces a low pass response which is partially canceled by the peaking of the high pass response. In one embodiment, two negative feedback capacitors 524, 526 are optionally employed to reduce the level of peaking to an acceptable level.

Linearized emitter follower 509 cascaded with the external differential amplifier are linear by design because, except for second order effects, two identical non-linearities are generated with symmetric operating points and are canceled against each other. As such, the exact model of the non-linearity is unimportant. Accordingly, the design of linearized emitter follower 509 shown in FIG. 3 is very immune to temperature variations during circuit use and process variations during fabrications. In addition, linearized emitter follower 509 does not modify the differential portion of the circuit which is the external differential amplifier, and therefore the common mode rejection of the circuit is unaffected by the linearization.

Sampling switch 204 of FIG. 2 is preferably designed to provide very fast switching characteristics. Emitter follower circuits characteristically provide constant transistor current regardless of the voltage being buffered. The use of an emitter follower as a sampling switch 24 for a track-and-hold circuit is thus advantageous because, among other things, when the sampling switch 204 turns off and enters a high-impedance state, both the input IN and differential input IN' are turned off, which results in symmetric switching discontinuities. In other words, during a track mode, sampling switch 204 has the ability to pull the output high or low at will. The emitter follower is a better choice because it mitigates the effect of a finite switching time by being substantially immune to switching noise which is generated during this time. Faster switching times would be useful however switching the emitter follower faster than alternate circuits is difficult. One other way to mitigate this with alternate approaches is by increasing the holding capacitor size. The tradeoff of doing this is that the tracking bandwidth of such approaches is significantly impacted by a larger holding capacitor and are less desirable for a high speed A/D.

During a transition from track mode to hold mode, however, sampling switch 204 loses the ability to pull its output high before it loses its ability to pull it low, or vice versa. This results in the output moving up or down a given value during transition from track mode to hold mode. If this offset is independent of the value of the signal being tracked, then it will be canceled by the offset in the negative output in a differential track-and-hold circuit. Since an emitter follower maintains a constant transistor current, the emitter follower is not affected by the common mode switching noise generated during transition from track to hold mode. Accordingly, sampling switch 204 preferably incorporates an emitter follower in its design to provide good switching characteristics.

In the preferred embodiments of the present invention, two emitter followers are used in a pair and help cancel the switching noise. Several things make a pair of emitter follower a better choice that other elements. The bias current in a pair of emitter follower is independent of and does not change when the pair buffers a voltage signal from their inputs to theirs outputs. This fixed bias current causes the voltage based switching noise output by each element of the pair to be about the same regardless of the voltage signals carried by the pair at the time of the switching. The symmetric switching noise causes the differential processing to substantially reject the switching noise.

Symmetric in this case refers to the same voltage based switching noise found on the data and data' outputs of the switching device. Accordingly, differential processing rejects this noise because differential processing can be thought of as subtracting the data' signal from the data signals. Therefore, any symmetric signal which is common to both outputs may be rejected by the differential processing because it is canceled in the subtraction process.

The current is desirably constant to help insure that the switching noise is symmetric and caused by the current which is being turned off. The switching noise is a voltage effect caused by the current not turning off instantaneously. For the switching noise to be the same for the data and data' outputs of the sampling switch, the currents being switched should turn off at the same rate. The emitter follower buffers voltage signals while not changing its bias current. Therefore, regardless of the differential voltage signal carried between the outputs of a pair of emitter followers, the currents in each emitter follower is about the same as the other. This current can be switched off in both devices at the same rate because the currents start at the same levels regardless of the voltage signal being buffered.

Most alternate circuits vary a current between the differential parts of the circuit which is converted to a voltage by resistors. Therefore, the currents in the data and data' portions of these circuits may not start at the same level when the device it switched and these currents can not be turning them off at the same rate. If the ratios of the currents could be maintained as the device is turned off, then these alternate approach could be made to work. However, the non-linear nature of transistors makes it difficult for the ratio of current could be maintained.

Sampling switch 204 of FIG. 2 is also preferably implemented to prevent capacitive coupling between its input and output when it is in a high impedance state. Capacitive coupling is problematic because very little capacitance is used to hold the output during the hold mode. This capacitance is on the order of the parasitic capacitance of an off transistor. To combat this coupling mode, symmetric transistors are preferably coupled between the hold capacitors and the data inputs to the sampling switch. These transistors are used to equally couple each hold capacitor to both differential input signal inputs IN/IN'. These transistors operate to couple the same signals into the hold capacitors regardless of the input signal IN/IN'. Since input signal IN/IN' is carried differentially in the holding capacitors, common mode noise is rejected. When sampling switch 24 is in track mode, these additional transistors remain in the off state, resulting in negligible effects on the tracking operation of the track-and-hold circuit.

Figure 4:
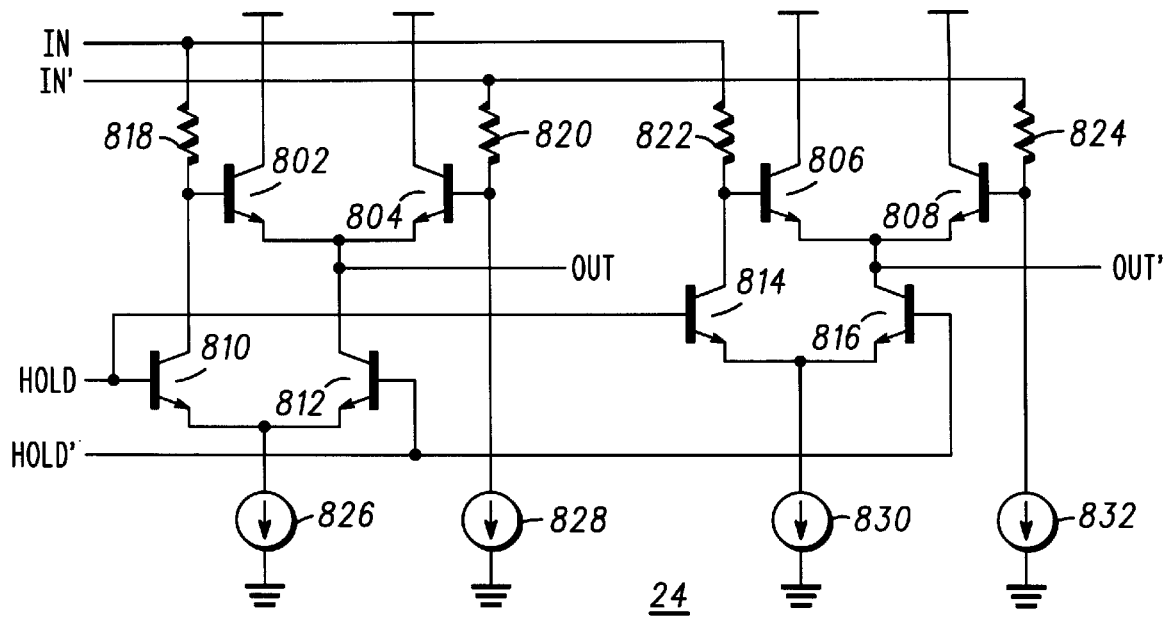
FIG. 4 is a schematic diagram of a sampling switch in accordance with a preferred embodiment of the present invention.

FIG. 4 is a schematic diagram of one embodiment of sampling switch 204 of FIG. 2 in accordance with a preferred embodiment of the present invention. Tracking mode of sampling switch 204 of FIG. 4 is entered by pulling the HOLD' input signal above the HOLD input signal. Current sources 826 and 830 are coupled to the collectors of transistors 812 and 816. Currents then flow into the emitters of transistors 802 and 806. Therefore, the outputs OUT/OUT' are connected to the inputs by emitter followers formed with transistors 802 and 806. The currents of current sources 828 and 832 insures that the bases of transistors 804 and 808 are at a lower potential than the bases of transistors 802 and 806, respectively, and this ensures that transistors 804 and 808 are off during the track mode of the sampling switch 204.

The hold mode of the sampling switch 204 is entered by pulling the HOLD input signal above the HOLD' input signal. This redirects the current of current sources 826 and 830 out the collectors of 810 and 814. Therefore, the OUT output signal and OUT' output signal can no longer be pulled low because the transistors 812 and 816 are no longer sinking current. The new current flowing through resistors 818 and 822 from the collectors of transistors 810 and 814 causes the bases of transistors 802 and 806 to be pulled low. Since transistors 802 and 806 can only pull the outputs high by themselves, this causes these transistors to turn off also. Therefore, the output nodes for output signals OUT/OUT' are left floating in the "hold" state. In the "hold" state, transistors 802, 804, 806, 808 still connect the input signals to the outputs OUT/OUT' due to parasitic capacitances. However, transistors 802 and 804 operate symmetrically and couple the OUT node equally to both the IN and IN' inputs. This ensures good rejection of the signals carried on the inputs. A similar state occurs with transistors 806 and 808 for the OUT' node.

Read buffer 206 of FIG. 2 is preferably implemented to minimally disturb the signal output and held by sampling switch 204 while also providing fast settling time once the track-and-hold circuit 200 enters the hold mode.

Figure 5:
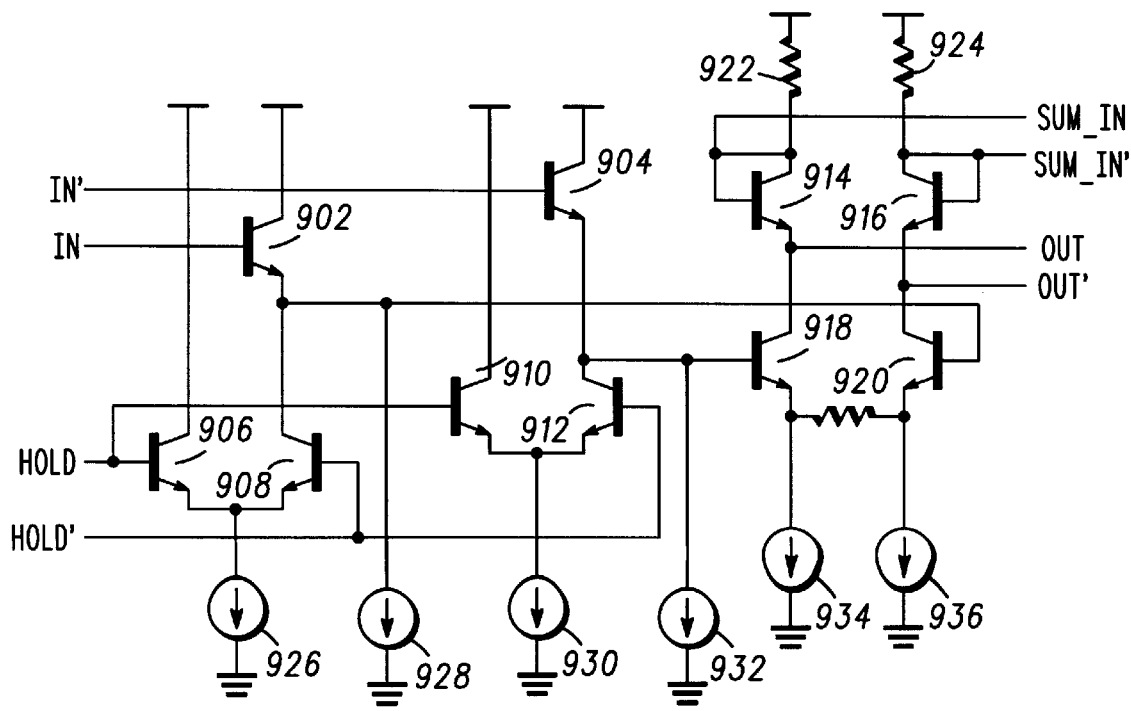
FIG. 5 is a schematic diagram of a read buffer in accordance with one embodiment of the present invention.

FIG. 5 is a schematic diagram of read buffer 206 in accordance with one embodiment of the present invention. Read buffer 206 employs differential circuit techniques to allow the read buffer 206 to draw off the same current from both holding capacitors without affecting the held value. Therefore, the potential across these capacitors can drop up to 1 volt without affecting their held value. The 1 volt limit is set by the sampling switch 204 dropping out of its high impedance off states for droops larger than a volt.

To help ensure a fixed current, the first stage of the read buffer 206 is an emitter follower. The constant transistor current provided by the emitter follower results in a constant read current. The current level of the emitter follower is desirably high to result in fast settling times and to be low to minimize the droop rate of the holding capacitors. Both of these goals are accomplished by operating the emitter follower with high current during track mode of the circuit and low current during hold mode. The high current during track mode results in output signal OUT/OUT' at the output of read buffer 206 being correct just prior to entering hold mode. The low current during hold mode would normally result in the read buffer taking a long time to settle; however, because the signal is already settled at the time hold mode is entered, the droop rate of the holding capacitors is minimized without adversely impacting the settling time of the output signal OUT/OUT'.

Read buffer 206 also includes a differential amplifier circuit with transistors 914, 916 and resistor 922, 924 loads. The purpose of the differential amplifier portion of read buffer 206 is to level shift the output signal back up towards ground and to reject the common mode signal carried in the holding capacitors. The transistors 914, 916 are included in the loads to linearize the output of the differential amplifier.

Transistors 902 and 904 are the transistors which form the emitter follower. Transistors 906, 908, 910 and 912 are switching elements which are considered to be part of the current sources of the emitter follower. Other switched current sources could be used in place of these transistors without changing the intent of the circuit. Transistors 906, 908, 910, 912 operate to dump current of current sources 926 and 930 while the track-and-hold circuit 200 is in hold mode. Therefore, during hold mode, the emitter followers of the read buffer 206 operate at the current levels set by current sources 928 and 932. These current sources 928, 932 are preferably set at 10% of the current levels of current sources 926, 930 to minimize the current drawn by the bases of transistors 902 and 904 during hold mode. Transistors 902 and 904 are run at the full currents of combined current sources 926 and 930 and combined current sources 930 and 932 during track mode because their base currents do not adversely affect operation during this mode and because it allows the signal to settle faster. Transistors 914 and 916 operate to linearize the differential amplifier portion of the read buffer 206.

The input and output of the circuit are voltage based signals. Currents are switched to generate the desired voltages. This switching of currents causes the transistors to generate small voltage non-linearities. The currents of transistors 918 and 914 are substantially the same as each other. The currents of transistors 920 and 916 are substantially the same. However, the currents of transistors 918 and 920 are not necessarily the same. This causes a differential non-linear error to occur when the voltage signal input into 918 and 920 is converted to a current signal and output the collectors of these transistors. When transistors 914 and 916 are not in the circuit, this current non-linearity is converted to a voltage non-linearity by resistors 922 and 924. Since transistors 914 and 916 do not change the currents sent to resistors 922 and 924, this non-linearity exists in the differential voltage signal at nodes sum__in and sum__in'. The purpose of transistors 914 and 916 is, among other things, to add a negative voltage non-linearity to the signal in order to substantially cancel the non-linear part of the signal which is on nodes sum__in and sum__in'.

In the preferred embodiment, for optimum linear performance the currents of transistors 918 and 914 are substantially the same, the currents of transistors 920 and 916 are the same, the gain of the circuit is designed to be unity, and the 4 transistors are the same size. In this embodiment, the two non-linearities cancel.

The circuit as designed is substantially immune to process, temperature and modeling errors because, among other things, the canceling of the non-linearities is performed using symmetry. This symmetry is also done with the linearized emitter follower circuit.

Figure 6:
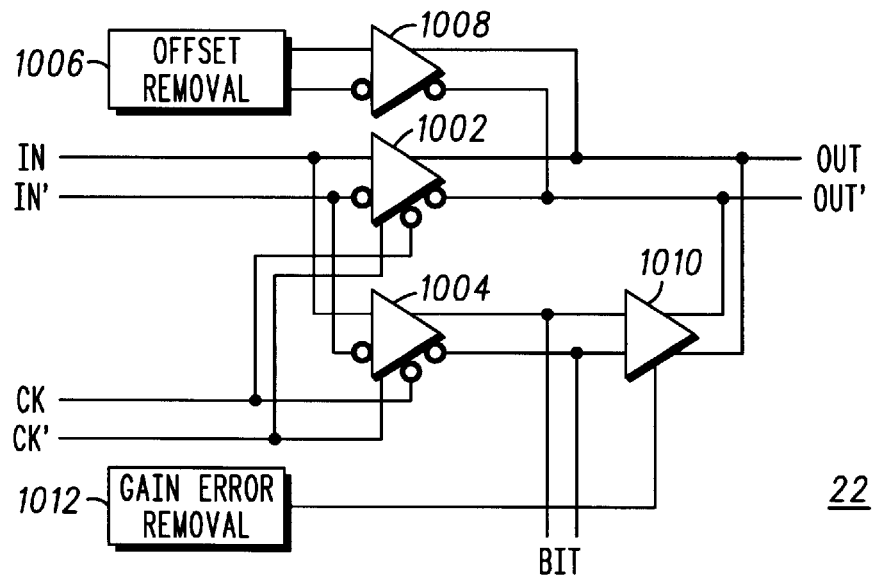
FIG. 6 is a block diagram of a pipeline track-and-hold stage in accordance with a preferred embodiment of the present invention.

FIG. 6 is a block diagram of a pipeline track-and-hold stage in accordance with a preferred embodiment of the present invention. Pipeline track-and-hold stage 20 includes input track-and-hold circuit 1002, binary quantizing circuit 1004, offset removal D/A converter 1006, analog differential amplifier 1008, digital differential amplifier 1010, and gain error removal D/A 1012. Binary quantizing circuit 1004 performs a comparison/decision function and a latching function. A latching operation is performed by binary quantizing circuit 1004 in order to match the delay in the track-and-hold circuit 1002. Buffering keeps the analog voltages output by track-and-hold circuit 1002 from being injected back onto the digital bit estimates. Subtraction using Current Mode Logic (CML) is performed by summing the output currents of two differential amplifiers 1008 and 1010. Accordingly, digital CML differential amplifier 1010 is included to preserve the digital bit estimates of the A/D converter. There are three current mode signals which are being summed/subtracted. The output of the track and hold, the output of 1008 and the output of 1010. These currents are summed by tying the outputs together. Load resistors are preferably used on the summing nodes to convert the currents to voltages. In general, these resistors may be located anywhere. In this case, these resistors are in the track and hold circuit, 1002. It is not desirable to pass the currents of 1010 and 1008 through transistors 914 and 916 which are in circuit 1002. Passing these currents through these transistors causes the voltage drop of these elements to change. To help keep this from happening, the output currents of 1010 and 1008 are converted to voltages by resistors 922 and 924 by being summed through nodes Sum_IN and Sum_In', shown in FIG. 5.

Gain error removal D/A 1012 is included to help compensate for circuit fabrication errors. For a cascaded structure such as used in the invention, errors made in each pipelined track-and-hold stage 20 are cumulative. If the digital +1 and −1 values being subtracted from the track-and-hold circuit 1002 vary across the stages, this is equivalent to the analog gain of the track-and-hold circuit 1002 not being precisely 2. Since either can occur and they are equivalent, gain error removal D/A is intended to correct for variations in the voltage of the digital +1's and −1's being subtracted and for variations from the gain of 2 of each track-and-hold circuit 1002. To illustrate how a single correction can fix both error sources, consider a case where each track-and-hold stage 20 has a gain of 1. For this case, the +1's and −1's of the decisions being subtracted would have to have voltages which get progressively smaller. The ratio of the voltages between two adjacent stages used to represent the +1's and −1's would have to be 0.5 for this case. The gain of 2 per track-and-hold stage is thus preferably implemented to help keep the levels of voltages seen by each stage 20 of the A/D converter 10 constant. However, slight variations are not an issue if they are compensated for by gain error D/A. Gain error D/A operates to increase or decrease the current output by digital CML differential amplifier 1010. Conventional methods are known in the art for using a D/A voltage to control the current source in digital CML differential amplifier 1010. Since digital CML differential amplifier 1010 fully switches the source current between its two differential outputs, the voltage used to represent the bit decisions is changed by varying the source current.

The offset removal D/A 1006 corrects for DC bias errors in the track-and-hold path or the decision subtraction path by injecting current sufficient to cancel the offset. Read buffer 206 in FIG. 5 includes inputs SUM_IN and SUM_IN'. Any current summed through transistors 914 and 916 to ground would result in a non-linear conversion of current to voltage. However, the current which is summed is instead injected into the read buffer 206 at nodes SUM_IN and SUM_IN'. Since injecting current at these nodes does not significantly change the current flowing through transistors 914 and 916, the voltage drop across these elements is fixed relative to the external current being summed. Therefore, the current injected at the SUM_IN, SUM_IN' nodes is converted to voltage by R1 and R2, and is summed to the OUT, OUT' nodes by the fixed voltage drop across transistors 914 and 916. Transistors 914 and 916 still perform the linearizing functions discussed previously because the output currents of transistors 918 and 920 still flow through these elements.

Figure 7:
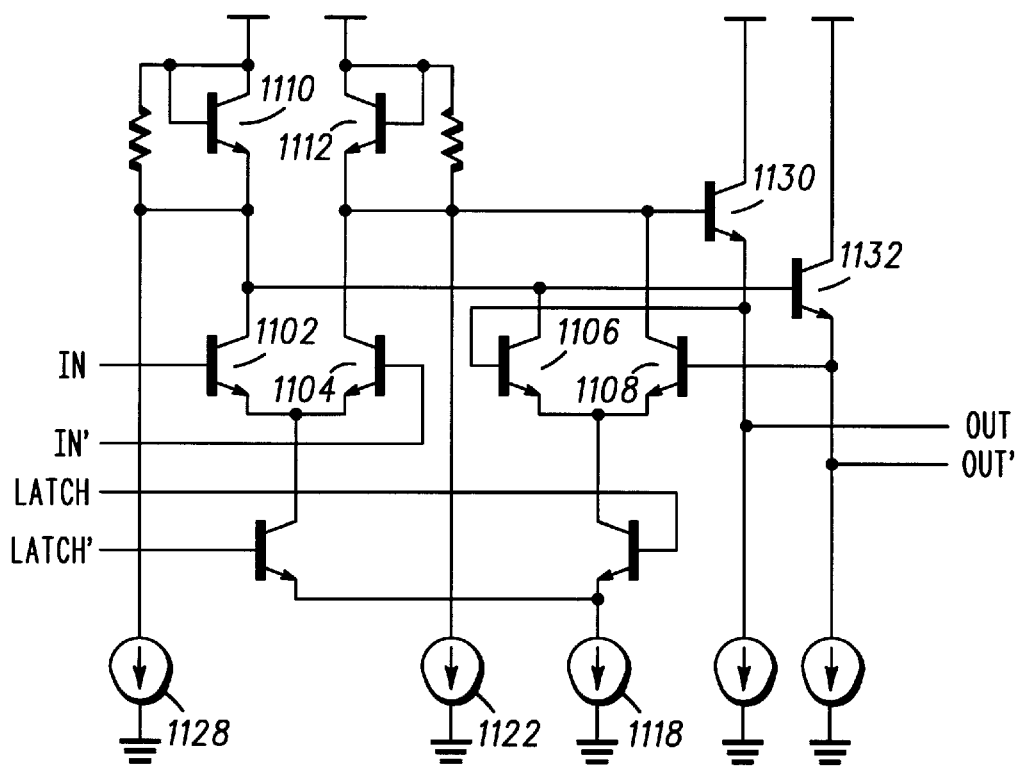
FIG. 7 is a schematic diagram of a binary quantizing circuit in accordance with a preferred embodiment of the present invention.

FIG. 7 is a schematic diagram of binary quantizing circuit 1004. Since the output of binary quantizing circuit 1004 is summed directly into the output of track-and-hold circuit 1002, both elements desirably have good settling times. The characteristics of a good latch for an A/D element is an ability to quickly decide between small positive or negative inputs. Once the circuit decides on a value, then the output should settle quickly to a digital +1 or −1 value. According to the architecture of the invention, the bandwidth of the binary quantizing circuit 1004 is not as important because the input is being held by the prior stage's track-and-hold circuit.

A critical issue with sampling devices is meta-stability concerns. When near zero voltages are input, the circuit does not make a decision until switched to the latched state. In the latched state, the meta-stable point is not stable but it takes time for the feedback of the latch circuit to leave this state. Normally, a small amount of self noise is capable of driving the circuit to a decision in the latched state. To combat meta-stability issues, it is desirable to have a very large gain such that all but the smallest of inputs are decided by the circuit prior to entering the latched state. To achieve a large gain, however, results in a tradeoff in the settling time.

Figure 8:
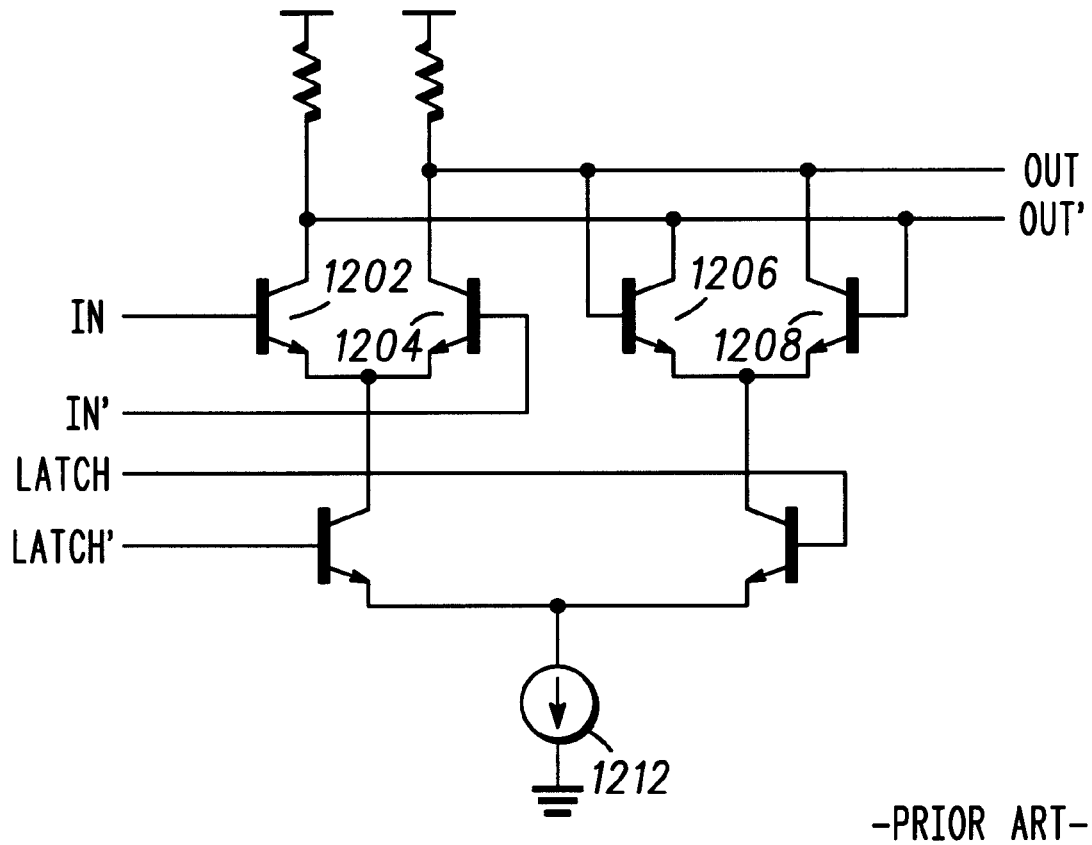
FIG. 8 is a schematic diagram of a prior art binary quantizing circuit.

FIG. 8 is a schematic diagram of a prior art binary quantizing circuit 1200. The settling time of prior art binary quantizing circuit 1200 is asymmetric. When the signal is close enough to zero that the differential amplifier formed by transistors 1202 and 1204 is not fully switched, then transistors 1206 and 1208 will start in a partially switched state when the circuit is switched to the latched state. The positive feedback of transistors 1206 and 1208 cause one transistor to turn progressively more on while the other is turning progressively more off.

Because of the asymmetries in a base emitter junction, once the off transistor reaches zero current, very little negative current flows. Therefore, the off transistors will naturally not overshoot significantly. However, the transistor which is turning on is capable of drawing current from the parasitic capacitances of the circuit and can source more current than is supplied by current source 1212 while settling. Therefore, this transistor causes settling time asymmetries in the outputs.

The binary quantizing circuit 1100 in accordance with the invention, as shown in FIG. 7, includes transistors 1102 through 1108 arranged in a similar configuration as that shown in FIG. 8. However, binary quantizing circuit 1100 also includes transistors 1110 and 1112 to combat overshoot of any transistors which injects positive current into resistors R1 or R2. Transistors 1110 and 1112 is to provide a low impedance for the overshoot current. Once the emitters of transistors 1110 and 1112 reach approximately 0.85 volts below ground, they sink additional current without changing voltage significantly. Therefore, they clamp the maximum negative voltages which will be seen at R1 or R2. Current sources 1120 and 1122 provide a fixed current through R1 and R2 regardless of the state of the latch. Too large of a differential voltage results in a longer settling time. Current sources 1120 and 1122 reduce the differential voltage from 0.85 volts by pulling the off voltages of R1 and R2 lower.

Binary quantizing circuit 1100 also includes transistors 1130 and 1132 which form an emitter follower circuit. Without transistors 1130 and 1132 the base of one of transistors 1106 or 1108 becomes more positive than its collector when the circuit is latched. The 0.85 volt shift provided by transistors 1130 and 1132 keep transistors 1106 and 1108 from becoming partially saturated. Saturation is implied by the base being more positive than the collector. Saturating a transistor may slow its response and injects noise into adjacent transistors in an integrated circuit die. Transistors 1130 and 1132 also operate to help keep loading of the internal latching nodes to a minimum.

As described previously, to achieve high speed A/D conversion, the sampling circuits used to implement each pipeline stage in a pipelined architecture desirably has very high tracking bandwidth, very low sampling aperture, and high linearity. A pipelined A/D converter in accordance with the invention was simulated and achieved the following performance statistics: tracking bandwidth of 6.2 GHz, sampling aperture time of 65 psec, sampling aperture bandwidth of 7.7 GHz, and sampling error of 1 LSB of a 17 bit A/D converter.

In one embodiment, the clocks are staggered when the track and hold is used in a stand alone configuration with slower speed commercial A/D's. The clocks may also be staggering when the sample rate of the complete A/D is increased to a more useful rate.

The present invention provides two embodiments for sampling with staggered clocks. In the first embodiment, commercially available A/D's may be used while taking advantage of the track and hold characteristics. The accuracy of this A/D is not known, for some applications it may not provide sufficient number of bits of resolution. For these applications it is desirable to use the track and hold circuit in a stand alone configuration to increase the effective speed of commercially available parts.

In this first embodiment, the track and hold circuit operates in a stand alone state. Typical commercial A/D's do not necessarily have tracking bandwidths or sampling apertures which are good enough to sample high speed signals even when enough of them are used in parallel to support the sample rate desired. In this embodiment of the present invention, the track and hold samples a high speed signal and holds it stable for quantization by a low speed A/D. When this is done, each low speed A/D uses a separate track and hold and the staggering of the clocks described above is performed.

In the second embodiment, the sample rate of the A/D is lower than what is desired for the speed of the signals being sampled by the A/D. Higher sample rate is accomplished by operating the A/D in parallel. When speed is applied to typical commercially available A/D's, the track and hold is placed in front of these A/D's and mitigates speed related issues for these A/D. However, when speed is applied to operating the A/D in parallel of the present invention, its meaning is ambiguous.

In accordance with the present invention, speed may refer to tracking bandwidth, sampling aperture or sampling rate and each of these are independent. Preferably speed refers to sample rate. For maximum sampling accuracy, the sample rate of a single circuit is desirably kept below about 1 GHz. To take full advantage of the tracking bandwidth and sampling aperture of the present invention, a higher sample rate than 1 GHz is desirable.

Accordingly, the pipelined A/D converter of the invention allows slower speed A/Ds to be operated in parallel to achieve the desired conversion rate. In an illustrative embodiment, each A/D operates at a nominal rate of $¼^{th}$ of the sample rate, and a track-and-hold circuit holds the signal constant during A/D conversion. In the illustrative embodiment, each input channel uses four A/D converters, but the A/D converters need only support a quarter of the bandwidth and clock rates of a single A/D solution. In this embodiment, the phases of the sampling clocks input into the four slower speed A/D converters are skewed by 0°, 90°, 180°, and 270° to make the A/D converters sample different parts of the signal correctly.

The lower number of gates required to implement the A/D is an advantage of the A/D for use in this second embodiment. Die size limits exist and the low usage of the limited die resources by the A/D may allow multiple A/D's to be implemented on the same die. This is an advantage of the A/D relative to other architectures because other architectures may not allow the speed of the A/D to be increased with a parallel approach while using a single die because of limited die resources and because of the higher resource usage of these alternate approaches.

Increasing the speed of the A/D by using multiple A/D circuits on the same die is the preferred approach of this second embodiment. Some of the advantages are that the fanout of signal being digitized and phasing of the sampling clocks are easier to control. Matching of parasitic and other issues which effect parallel operation of the A/D are easier to insure internal to a single die because all circuits implemented on the same die operate substantially the same. The manufacturing variations are easier to control in an IC manufacturing environment relative parallel operation of the A/D using multiple die and this is one of the advantages of the preferred approach of this second embodiment. Other design issues such as minimizing the complexity of each die might make using multiple die in parallel more desirable for some applications and the preferred approach of this second embodiment may not be preferred for all applications.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. An analog-to-digital converter comprising:
   a sampling portion for sampling an analog input signal and producing a differential sampled input signal;
   a plurality of cascade-coupled pipelined track-and-hold stages, each comprising:
   a track-and-hold (T/H) circuit responsive to a differential analog input signal and a mode signal which generates a differential sampled analog signal, said T/H circuit comprising:
      a input buffer which receives said differential analog input signal and produces a differential buffered analog input signal;
      a sampling switch coupled to said input buffer and responsive to said mode signal to generate a differential sampling switch output signal, said differential sampling switch output signal corresponding to said differential analog input signal when said mode signal indicates a track mode, and corresponding to a value of said differential analog input signal at a time when said mode signal transitions from said track mode to a hold mode; and
      a read buffer coupled to said sampling switch which reads said differential sampling switch output signal without disturbing said differential sampling switch output signal to generate said differential sampled analog signal, and
      wherein the sampling switch comprises an emitter follower buffer coupled between an input and output of said sampling switch which operates substantially as an emitter follower during the track mode, and refraining from said substantially operating substantially during the hold mode.

2. An analog-to-digital converter as claimed in claim 1 further comprising:
   a binary quantizing circuit which receives said differential analog input signal and generates a quantized analog signal;
   a summing circuit which receives and adds said differential sampled analog signal and said quantized analog signal to generate a residual differential analog signal, wherein a first of said plurality of cascade-coupled pipelined T/H stages receives said differential sampled input signal as its respective differential analog input signal, and each successive cascade-coupled pipelined T/H stage receives said residual differential analog signal of its preceding cascade-coupled pipelined T/H stage as its respective differential analog input signal; and
   means for combining said quantized analog signal from each binary quantizing circuit into a quantized digital output signal, and
   wherein the T/H circuit comprises a feed-forward topology without a feed-back path between the read buffer and the sampling switch, and
   wherein the sampling portion compresses said binary quantizing circuit having a pair of transistors for sinking overshoot current for reducing settling time of the binary quantizing circuit.

3. An analog-to-digital converter comprising:
   means for sampling an analog input signal and producing a differential sampled input signal;
   a plurality of cascade-coupled pipelined track-and-hold stages, each comprising:
   a track-and-hold (T/H) circuit responsive to a differential analog input signal and a mode signal which generates a differential sampled analog signal, said T/H circuit comprising:
      a input buffer which receives said differential analog input signal and produces a differential buffered analog input signal;
   a sampling switch coupled to said input buffer and responsive to said mode signal to generate a differential sampling switch output signal, said differential sampling switch output signal corresponding to said differential analog input signal when said mode signal indicates a track mode, and corresponding to a value of said differential analog input signal at a time when said mode signal transitions from said track mode to a hold mode, said sampling switch comprising an emitter follower buffer coupled between an input and output of said sampling switch which operates substantially as an emitter follower during the track mode, and refraining from said operating during the hold mode;
   a read buffer coupled to said sampling switch which reads said differential sampling switch output signal without disturbing said differential sampling switch output signal to generate said differential sampled analog signal;
   a binary quantizing circuit which receives said differential analog input signal and generates a quantized analog signal, said binary quantizing circuit having a pair of transistors for sinking overshoot current for reducing settling time of the binary quantizing circuit;
   a summing circuit which receives and adds said differential sampled analog signal and said quantized analog signal to generate a residual differential analog signal, wherein a first of said plurality of cascade-coupled pipelined T/H stages receives said differential sampled input signal as its respective differential analog input signal, and each successive cascade-coupled pipelined T/H stage receives said residual differential analog signal of its preceding cascade-coupled pipelined T/H stage as its respective differential analog input signal; and
   means for combining said quantized analog signal from each of said binary quantizing circuits into a quantized digital output signal.

4. An analog-to-digital converter in accordance with claim 3, wherein:
   the T/H circuit comprises a feed-forward topology without a feed-back path between the read buffer and the sampling switch.

5. An analog-to-digital converter comprising:
   means for sampling an analog input signal and producing a differential sampled input signal;
   a plurality of cascade-coupled pipelined track-and-hold stages, each comprising:
   a track-and-hold (T/H) circuit responsive to a differential analog input signal and a mode signal which generates a differential sampled analog signal, said T/H circuit comprising:

a input buffer which receives said differential analog input signal and produces a differential buffered analog input signal;

a sampling switch coupled to said input buffer and responsive to said mode signal to generate a differential sampling switch output signal, said differential sampling switch output signal corresponding to said differential analog input signal when said mode signal indicates a track mode, and corresponding to a value of said differential analog input signal at a time when said mode signal transitions from said track mode to a hold mode;

a read buffer coupled to said sampling switch which reads said differential sampling switch output signal without disturbing said differential sampling switch output signal to generate said differential sampled analog signal;

a binary quantizing circuit which receives said differential analog input signal and generates a quantized analog signal;

a summing circuit which receives and adds said differential sampled analog signal and said quantized analog signal to generate a residual differential analog signal, wherein a first of said plurality of cascade-coupled pipelined T/H stages receives said differential sampled input signal as its respective differential analog input signal, and each successive cascade-coupled pipelined T/H stage receives said residual differential analog signal of its preceding cascade-coupled pipelined T/H stage as its respective differential analog input signal; and means for combining said quantized analog signal from each of said binary quantizing circuits into a quantized digital output signal, wherein:

said input buffer comprises a linearized emitter follower circuit cascaded with a differential amplifier, said input buffer comprises:

a first differential pair of matching transistors, each respectively coupled between a voltage source and a respective first and second output node, and each respectively controlled by an input signal and a complement input signal, together comprising said differential analog input signal;

a second differential pair of matching transistors, each respectively coupled between said first and second output nodes and a first and second current source, and each respectively controlled by said respective complement input signal and said input signal, said first and second current sources respectively operable to supply a constant current on a respective first and second intermediate node; and a resistor coupled between said respective first and second intermediate nodes.

6. An analog-to-digital converter in accordance with claim 5, comprising:

a pair of negative feedback capacitors respectively coupled between said respective first and second input nodes and said respective second and first intermediate nodes.

7. An analog-to-digital converter comprising:

means for sampling an analog input signal and producing a differential sampled input signal;

a plurality of cascade-coupled pipelined track-and-hold stages, each comprising:

a track-and-hold (T/H) circuit responsive to a differential analog input signal and a mode signal which generates a differential sampled analog signal, said T/H circuit comprising:

a input buffer which receives said differential analog input signal and produces a differential buffered analog input signal;

a sampling switch coupled to said input buffer and responsive to said mode signal to generate a differential sampling switch output signal, said differential sampling switch output signal corresponding to said differential analog input signal when said mode signal indicates a track mode, and corresponding to a value of said differential analog input signal at a time when said mode signal transitions from said track mode to a hold mode;

a read buffer coupled to said sampling switch which reads said differential sampling switch output signal without disturbing said differential sampling switch output signal to generate said differential sampled analog signal;

a binary quantizing circuit which receives said differential analog input signal and generates a quantized analog signal;

a summing circuit which receives and adds said differential sampled analog signal and said quantized analog signal to generate a residual differential analog signal, wherein a first of said plurality of cascade-coupled pipelined T/H stages receives said differential sampled input signal as its respective differential analog input signal, and each successive cascade-coupled pipelined T/H stage receives said residual differential analog signal of its preceding cascade-coupled pipelined T/H stage as its respective differential analog input signal; and means for combining said quantized analog signal from each of said binary quantizing circuits into a quantized digital output signal, wherein:

said sampling switch comprises:

a emitter follower circuit; and means to prevent capacitive coupling between an input and an output of said sampling switch.

8. An analog-to-digital converter in accordance with claim 7, wherein:

said sampling switch comprises:

a first differential pair of matching transistors, each respectively coupled between a voltage source and a first output node, and each respectively controlled by an input signal and a complement input signal, together comprising said differential buffered analog input signal;

a second differential pair of matching transistors, each respectively coupled between a respective first intermediate node and said first output node and a first current source, and each respectively controlled by a respective track/hold signal and a respective complement track/hold signal which together comprise said mode signal;

a third differential pair of matching transistors, each respectively coupled between a voltage source and a second output node, and each respectively controlled by said input signal and said complement input signal; and a fourth differential pair of matching transistors, each respectively coupled between said respective second output node and a respective second intermediate node and a second current source, and each respectively controlled by said respective track/hold signal and said respective complement track/hold signal, wherein said differential sampling switch output signal is taken on said first and second output nodes.

9. An analog-to digital converter in accordance with claim 3, wherein the T/H circuit comprises a feed-forward topology without a feed-back path between the read buffer and the sampling switch.

10. An analog-to-digital converter comprising:
    means for sampling an analog input signal and producing a differential sampled input signal;
    a plurality of cascade-coupled pipelined track-and-hold stages, each comprising:
        a track-and-hold (T/H) circuit responsive to a differential analog input signal and a mode signal which generates a differential sampled analog signal, said T/H circuit comprising:
            a input buffer which receives said differential analog input signal and produces a differential buffered analog input signal;
            a sampling switch coupled to said input buffer and responsive to said mode signal to generate a differential sampling switch output signal, said differential sampling switch output signal corresponding to said differential analog input signal when said mode signal indicates a track mode, and corresponding to a value of said differential analog input signal at a time when said mode signal transitions from said track mode to a hold mode;
            a read buffer coupled to said sampling switch which reads said differential sampling switch output signal without disturbing said differential sampling switch output signal to generate said differential sampled analog signal;
        a binary quantizing circuit which receives said differential analog input signal and generates a quantized analog signal;
        a summing circuit which receives and adds said differential sampled analog signal and said quantized analog signal to generate a residual differential analog signal, wherein a first of said plurality of cascade-coupled pipelined T/H stages receives said differential sampled input signal as its respective differential analog input signal, and each successive cascade-coupled pipelined T/H stage receives said residual differential analog signal of its preceding cascade-coupled pipelined T/H stage as its respective differential analog input signal; and
    means for combining said quantized analog signal from each of said binary quantizing circuits into a quantized digital output signal,
    and wherein said read buffer comprises a linearized track-and-hold circuit comprising an emitter follower circuit followed by a differential amplifier circuit; wherein:
        said read buffer comprises:
            a first differential pair of matching transistors, each respectively coupled between a voltage source and a respective first and second intermediate node, and each respectively controlled by an input signal and a complement input signal, together comprising said differential sampling switch output signal;
            a second differential pair of matching transistors, each respectively coupled between said respective voltage source and said respective first intermediate node and a first current source, and each respectively controlled by a respective track/hold signal and a respective complement track/hold signal which together comprise said mode signal;
            a third differential pair of matching transistors, each respectively coupled between said respective voltage source and said respective second intermediate node and a second current source, and each respectively controlled by said respective track/hold signal and said respective complement track/hold signal;
            a third current source operable to maintain a constant current on said first intermediate node;
            a fourth current source operable to maintain a constant current on said second intermediate node;
            a fourth differential pair of matching transistors, each respectively coupled between a voltage source and a respective first and second output node;
            a fifth differential pair of matching transistors, each respectively coupled between said first and second output nodes and a fifth and sixth current source, and each respectively controlled by a signal present on said respective first and second intermediate nodes, said respective fifth and sixth current sources respectively operable to supply a constant current on a respective third and fourth intermediate node; and
            a resistor coupled between said respective third and fourth intermediate nodes.

11. An analog-to-digital converter in accordance with claim 10, wherein said read buffer is operable with high current during said track mode and low current during said hold mode.

12. A track-and-hold (T/H) circuit responsive to a differential analog input signal and a mode signal which generates a differential sampled analog signal, said T/H circuit comprising:
    an input buffer which receives said differential analog input signal and produces a differential buffered analog input signal;
    a sampling switch coupled to said input buffer and responsive to said mode signal to generate a differential sampling switch output signal, said differential sampling switch output signal corresponding to said differential analog input signal when said mode signal indicates a track mode, and corresponding to a value of said differential analog input signal at a time when said mode signal transitions from said track mode to a hold mode, the sampling switch comprising an emitter follower buffer coupled between an input and output of said sampling switch which operates substantially as an emitter follower during the track mode, and refraining from said operating during the hold mode; and
    a read buffer coupled to said sampling switch which reads said differential sampling switch output signal without disturbing said differential sampling switch output signal to generate said differential sampled analog signal.

13. A method of converting an analog signal to a digital signal comprising the steps of:
    sampling an analog input signal and producing a differential sampled analog input signal;
    generating a differential sampled signal with each of a plurality of cascade-coupled pipelined track-and-hold stages, each track and hold stage:
        receiving through an input buffer, said differential sampled analog input signal;
        producing a differential buffered analog input signal;

generate a differential sampling switch output signal with a sampling switch coupled to said input buffer and responsive to a mode signal, said differential sampling switch output signal corresponding to said differential sampled analog input signal when said mode signal indicates a track mode, and corresponding to a value of said differential sampled analog input signal at a time when said mode signal transitions from said track mode to a hold mode; and reading said differential sampling switch output signal without disturbing said differential sampling switch output signal to generate said differential sampled signal, wherein the sampling switch comprises an emitter follower buffer coupled between an input and output of said sampling switch operating substantially as an emitter follower during the track mode, and refraining from said operating during the hold mode.

14. The method as claimed in claim 13 further comprising the steps of:

a binary quantizing circuit receiving said differential analog input signal and generates a quantized analog signal, said binary quantizing circuit having a pair of transistors for sinking overshoot current for reducing settling time of the binary quantizing circuit;

a summing circuit receiving and adding said differential sampled analog signal and said quantized analog signal to generate a residual differential analog signal, wherein a first of said plurality of cascade-coupled pipelined T/H stages receiving said differential sampled input signal as its respective differential analog input signal, and each successive cascade-coupled pipelined T/H stage receiving said residual differential analog signal of its preceding cascade-coupled pipelined T/H stage as its respective differential analog input signal; and combining each quantized analog signal from said binary quantizing circuits into a quantized digital output signal, and wherein the pipelined T/H stages comprise a feed-forward topology without a feedback path between a read buffer and the sampling switch.

* * * * *